United States Patent
Poechmueller

(10) Patent No.: US 6,522,578 B2
(45) Date of Patent: Feb. 18, 2003

(54) METHOD FOR PREVENTING ELECTROMIGRATION IN AN MRAM

(75) Inventor: Peter Poechmueller, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/898,791

(22) Filed: Jul. 3, 2001

(65) Prior Publication Data

US 2002/0001225 A1 Jan. 3, 2002

(30) Foreign Application Priority Data

Jul. 3, 2000 (DE) .......................... 100 32 278

(51) Int. Cl.⁷ .............................................. G11C 11/14
(52) U.S. Cl. ...................... 365/171; 365/158; 365/225.5
(58) Field of Search ........................... 365/189.01, 158, 365/225.5, 230.01, 171; 307/89, 90, 91

(56) References Cited

U.S. PATENT DOCUMENTS

| 3,587,066 | A | * | 6/1971 | Gibacier et al. | 365/218 |
| 6,134,138 | A | * | 10/2000 | Lu et al. | 365/158 |
| 6,219,273 | B1 | * | 4/2001 | Katti et al. | 365/158 |
| 6,363,002 | B1 | * | 3/2002 | Nishimura et al. | 365/145 |

* cited by examiner

Primary Examiner—Richard Elms
Assistant Examiner—Jung H. Hur
(74) Attorney, Agent, or Firm—Laurence A. Greenberg; Werner H. Stemer; Ralph E. Locher

(57) ABSTRACT

A method for preventing electromigration in a magnetic random access memory (MRAM) is described. In the method, after a programming step, a signal which compensates for the electromigration and has opposite polarity is fed to the wordline and bitline in such a way that programming does not occur in the memory cells.

2 Claims, 1 Drawing Sheet

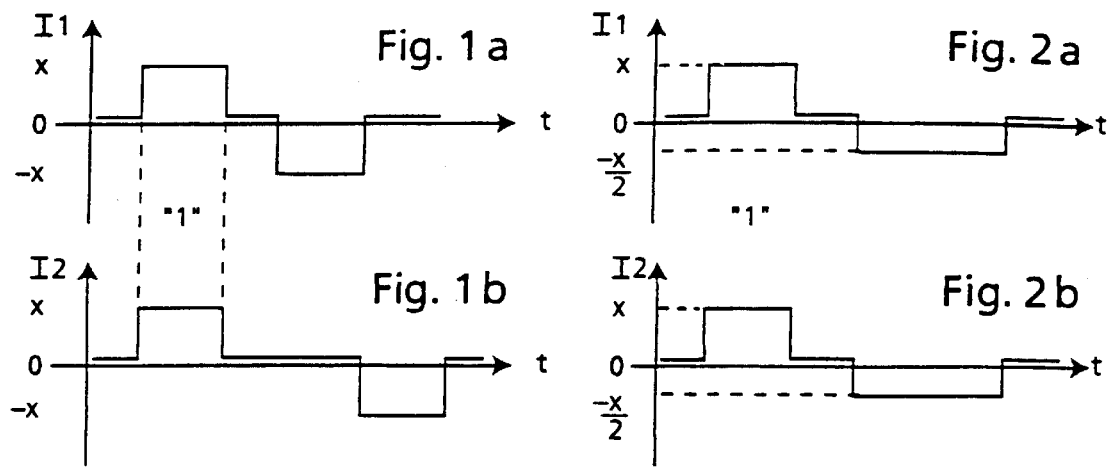
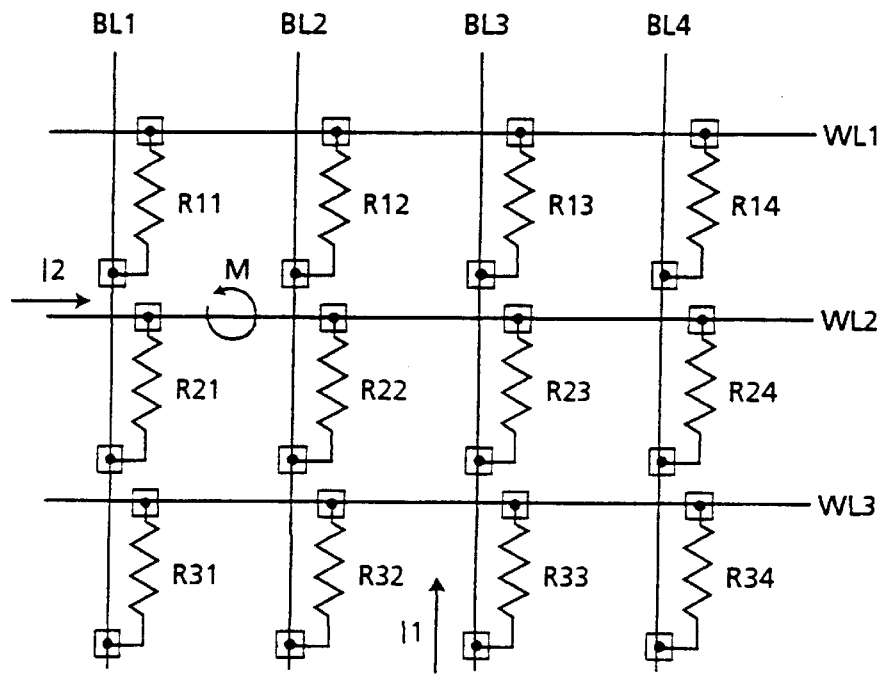
Fig. 3 PRIOR ART
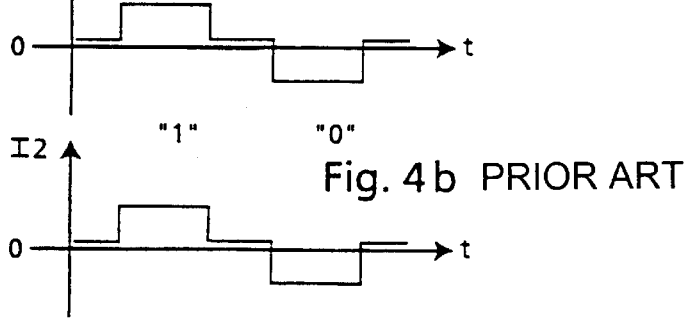

METHOD FOR PREVENTING ELECTROMIGRATION IN AN MRAM

BACKGROUND OF THE INVENTION

Field of the Invention

The present invention relates to a method for preventing electromigration in a magnetic random access memory (MRAM) composed of wordlines, bitlines which intersect the wordlines and resistors which are provided at the points of intersection between the wordlines and the bitlines. The resistors have resistance values that can be influenced by a magnetic field in such a way that they can be assigned to two logic states "0" or "1" in that the wordlines and bitlines associated with a selected resistor simultaneously each transmit, in a programming step, a DC signal and the DC signals together generate the magnetic field.

The structure of a conventional MRAM is composed of wordlines and bitlines which essentially intersect the wordlines perpendicularly. At the points of intersection between the wordlines and the bitlines there are memory cells which are each indicated by a resistor.

The resistor represents the path of a tunnel current which flows between a wordline and a bitline, if there is a voltage difference between the wordline and the bitline. The tunnel current then assumes a larger or smaller value as a function of a magnetic field that is written to the memory cell. In other words, the memory cell can be regarded as a binary resistor that is programmed with a larger or smaller resistance value. The information unit "1" or "0" can then be assigned to these two resistance values.

A memory cell is therefore programmed by applying a magnetic field. In order to program a memory cell to a value of "0" or "1", the magnetic field must exceed certain threshold values. It is to be noted here that the memory cell has a magnetic hysteresis.

A DC current that is flowing in the wordline brings about a magnetic field around the wordline. The direction of the magnetic field is reversed here if the current flows in the reverse direction. The direction of the magnetic field then indicates whether a "1" or a "0" is written to a memory cell.

It will be assumed that the current in the wordline signifies the information current "1". All the memory cells which are connected to the wordline, that is to say the memory cells with the resistors, have the magnetic field applied to them by the current. The effect of the hysteresis of the memory cells with the resistors is then that the magnetic field alone is from a "0" state into a "1" state. Instead, it is additionally necessary to actuate the bitline, with a current in order to generate, at the interface of the bitline with the wordline, a magnetic field which, as a result of the superposition of the magnetic fields generated by the currents, is sufficiently strong to change the "0" state into a "1" state at the interface, that is to say at the resistor. In other words, by actuating selected wordlines and selected bitlines it is possible to program the memory cells at the interfaces of these wordlines and bitlines into a "0" or "1" state as a function of the direction of the magnetic field generated by the respective currents.

Because currents which are applied in order to program the memory cells are DC currents, electromigration occurs owing to the programming if the same signal, that is to say for example a "1", is for the most part always written to the memory cell. The electromigration by the storage currents in the mA range ultimately signifies that material is transported, which can even lead to the respective metallic leads being destroyed. The service life of MRAMs is therefore undesirably restricted.

It is known that virtually no electromigration occurs when an alternating current is applied. However, it is not possible to use an alternating current in MRAMs because it is not possible to define memory contents by an alternating current.

SUMMARY OF THE INVENTION

It is accordingly an object of the invention to provide a method for preventing electromigration in an MRAM which overcomes the above-mentioned disadvantages of the prior art devices of this general type, which prevents electromigration in the MRAM in order to prevent the leads of the MRAM from being destroyed.

With the foregoing and other objects in view there is provided, in accordance with the invention, a method for preventing electromigration in a magnetic random access memory (MRAM) containing wordlines, bitlines intersecting the wordlines, and resistors provided at points of intersection between the wordlines and the bitlines. The resistors each have a resistance value that can be influenced by a magnetic field in such a way that it is assigned to two logic states "1" or "0". The method includes the steps of simultaneously transmitting, over a wordline and a bitline associated with a selected resistor, in a programming step, DC signals for generating the magnetic field. Each of the wordline and the bitline selected provides a respective DC signal forming the DC signals. Subsequently, transmitting over the wordline and the bitline to which the DC signals have been applied, further DC signals which are of opposite polarity to the DC signals.

The object is achieved according to the invention with a method of the type mentioned at the beginning, in such a way that, after the programming step, the wordline and bitline to which the DC signal is applied transmit a further DC signal which is of opposite polarity to the DC signal. The further DC signal is fed to the wordline and bitline associated with the selected resistor, but with offset timing or with a reduced amplitude and longer time period in comparison with the DC signal.

As a result of the offset in the timing of the further DC signals in the wordline and bitline and the reduced amplitude of the further DC signal, the magnetic field at the interfaces of the wordline and bitline, that is to say in the memory cells, does not exceed the threshold value which leads to information being written to the cell, and thus to the destruction of the information which has already been written.

In accordance with an added mode of the invention, there is the step of feeding the further DC signals with offset timing to the wordline and the bitline associated with the selected resistor.

In accordance with an additional mode of the invention, there is the step of feeding the further DC signals with a reduced amplitude and a longer time period in comparison with the DC signals applied to the wordline and the bitline associated with the selected resistor.

In accordance with a concomitant mode of the invention, there is the step of forming the further DC signals with approximately half an amplitude and twice the time period of the DC signals.

Other features which are considered as characteristic for the invention are set forth in the appended claims.

Although the invention is illustrated and described herein as embodied in a method for preventing electromigration in an MRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a and 1b are signal diagrams explaining a first exemplary embodiment of a method according to the invention;

FIGS. 2a and 2b are signal diagrams explaining a second exemplary embodiment of the method according to the invention;

FIG. 3 shows a general structure of an MRAM; and

FIGS. 4a and 4b are signal diagrams clarifying how a "1" or a "0" is written to a memory cell in the MRAM shown in FIG. 3.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 3 thereof, there is shown a structure of a conventional MRAM. It is composed of wordlines WL1, WL2, WL3, . . . and bitlines BL1, BL2, BL3, BL4, . . . which essentially intersect the wordlines WL1, WL2, WL3, . . . perpendicularly. At the points of intersection between the wordlines WL1, WL2, WL3, . . . and the bitlines BL1, BL2, BL3, BL4, . . . are memory cells which are each indicated by a resistor R11, R12, . . . R33, R34, and generally by Rij.

The resistor Rij represents the path of a tunnel current which flows between a wordline, for example the wordline WL2, and a bitline, for example the bitline BL3, if there is a voltage difference between the wordline WL2 and the bitline BL3. The tunnel current then assumes a larger or smaller value as a function of a magnetic field that is written to the memory cell. In other words, the memory cell can be regarded as a binary resistor that is programmed with a larger or smaller resistance value. The information unit "1" or "0" can then be assigned to these two resistance values.

A memory cell is therefore programmed by applying a magnetic field. In order to program a memory cell to a value of "0" or "1", the magnetic field must exceed certain threshold values. It is to be noted here that the memory cell has a magnetic hysteresis.

As is indicated in FIG. 3, for example, a DC current I2 that is flowing in the wordline WL2 brings about a magnetic field M around the wordline WL2. The direction of the magnetic field M is reversed here if the current I2 flows in the reverse direction. The direction of the magnetic field M then indicates whether a "1" or a "0" is written to a memory cell. It will be assumed that the current I2 in the wordline WL2 signifies the information current "1". All the memory cells which are connected to the wordline WL2, that is to say the memory cells with the resistors R21, R22, R23 and R24, have the magnetic field M applied to them by the current I2. The effect of the hysteresis of the memory cells with the resistors R21, R22, R23, R24 is then that the magnetic field M alone is not yet sufficiently strong to change all these memory cells from a "0" state into a "1" state. Instead, it is additionally necessary to actuate a bitline, for example the bitline BL3, with a current I1 in order to generate, at the interface of the bitline BL3 with the wordline WL2, a magnetic field which, as a result of the superposition of the magnetic fields generated by the currents I1 and I2, is sufficiently strong to change the "0" state into a "1" state at the interface, that is to say at the resistor R23. In other words, by actuating selected wordlines WLi and selected bitlines BLj it is possible to program the memory cells at the interfaces of the wordlines and bitlines into a "0" or "1" state as a function of the direction of the magnetic field generated by the respective currents.

Because currents I1 and I2 which are applied in order to program the memory cells are DC currents, electromigration occurs owing to the programming if the same signal, that is to say for example a "1", is for the most part always written to the memory cell. The electromigration by the storage currents in the mA range ultimately signifies that material is transported, which can even lead to the respective metallic leads being destroyed. The service life of MRAMs is therefore undesirably restricted.

The problem of electromigration mentioned above will be clarified again with reference to FIGS. 4a and 4b. The programming currents I1 and I2 are plotted against time t in FIGS. 4a and 4b. In order to write a "1" to the memory cell with the resistor R23, signals of positive polarity are used for the currents I1 and I2, while signals of negative polarity bring about the writing of a "0" to the memory cell. If "1" or "0" is always written to the memory cell with the resistor R23, the currents I1, I2 always flow in the same direction through the bitline BL3 or through the wordline WL2, which leads to electromigration. Material is transported in alternate directions, which prevents the destruction of the corresponding lines BL3 and WL2, only if "0" and "1" are alternately written to the memory cell with the resistor R23 in succession. However, because there are numerous application cases in which the same memory content, that is "0" or "1", is always written to a memory cell, it must be assumed that the electromigration leads to the leads being destroyed as a result of the transportation of material.

It is known that virtually no electromigration occurs when an alternating current is applied. However, it is not possible to use an alternating current in MRAMs because it is not possible to define memory contents by an alternating current.

FIGS. 1a and 1b each show—in a way similar to FIGS. 4a and 4b—the writing of a "1" in their left-hand half by simultaneously applying the currents I1 and I2 to the bitline BL3 or to the wordline WL2 (see FIG. 3). If a "0" is to be written instead of a "1", the polarity of the currents I1 and I2 is changed from +x to −x.

In order to compensate for the electromigration or the transportation of material, in the method according to the invention, signals of opposite polarity are applied with offset timing with respect to each other to the bitline BL3 and to the wordline WL2 after the programming step in which the "1" has been written to the memory cell with the resistor R23. As a result of the offset timing of the signals with the amplitude −x, it is ensured that the threshold value of the magnetic field that is necessary for writing is not exceeded in the memory cell with the resistor R23. That is to say the information stored in the memory cell, namely the "1", is completely retained and is not replaced by a "0", which would happen if the offset timing between the signals with the amplitude −x in the bitline BL3 or in the wordline WL2 were not present.

FIGS. 2a and 2b show a further exemplary embodiment of the method according to the invention in which, after the writing of a "1", a pulse with half the amplitude and opposite polarity is applied for a relatively long time period to the bitlines and wordlines of the memory cell to which the "1" has just been written. The half amplitude with the value −x/2 of the writing pulse with the value x reliably avoids destruction of the written information. However, at the same time, the electromigration is compensated as a result of the longer time period of this pulse with half the amplitude. Approximately twice the time period of the write pulse is preferably used for writing the information "1" for the time period of the pulse with half the amplitude.

In the exemplary embodiment in FIGS. 2a and 2b, the pulse which compensates for the electromigration and which has half the amplitude is applied to the bitlines and wordlines at the same time. However, it is, of course, also possible to provide offset timing in addition—similar to the example in FIGS. 1a and 1b.

In the exemplary embodiment in FIGS. 2a and 2b, the pulse that compensates the write signal has half the amplitude of the write signal. However, it is, of course, also possible to use other values for the compensation signal. The only decisive factor is that the threshold value for writing information is not exceeded at the same time as the compensation signal is applied to the bitline and the wordline.

I claim:

1. A method for preventing electromigration in a magnetic random access memory (MRAM) containing wordlines, bitlines intersecting the wordlines, and resistors provided at points of intersection between the wordlines and the bitlines, the resistors each having a resistance value that can be influenced by a magnetic field in such a way that it is assigned to two logic states "1" or "0", which comprises the steps of:

simultaneously transmitting, over a wordline and a bitline associated with a selected resistor, in a programming step, in each of the selected wordline and the selected bitline, a respective DC signal which form programing DC signals for generating the magnetic field; and after the programming step, transmitting Over the wordline and the bitline to which the programing DC signals have been applied, further DC signals which are of opposite polarity to the programing DC signals, the further DC signals being generated with a reduced amplitude and a longer time period in comparison with the programing DC signals applied to the wordline and the bitline associated with the selected resistor.

2. The method according to claim 1, which comprises forming the further DC signals with approximately half an amplitude and twice the time period of the programing DC signals.

* * * * *